United States Patent
Okada

(10) Patent No.: US 8,379,393 B2
(45) Date of Patent: Feb. 19, 2013

(54) SEMICONDUCTOR MEMORY CARD WITH CONTROLLER CHIP

(75) Inventor: Takashi Okada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 320 days.

(21) Appl. No.: 12/610,504

(22) Filed: Nov. 2, 2009

(65) Prior Publication Data

US 2010/0172112 A1    Jul. 8, 2010

(30) Foreign Application Priority Data

Jan. 7, 2009  (JP) ................................. 2009-001881

(51) Int. Cl.
*H05K 1/14* (2006.01)
(52) U.S. Cl. ........................................ 361/737; 361/748
(58) Field of Classification Search .................. 361/727, 361/737, 736, 748, 720, 679.32; 257/678–679
See application file for complete search history.

(56) References Cited

U.S. PATENT DOCUMENTS

| | | | |
|---|---|---|---|
| 4,532,419 A * | 7/1985 | Takeda ........................... | 235/492 |
| 5,815,426 A * | 9/1998 | Jigour et al. ..................... | 365/51 |
| 6,381,143 B1 * | 4/2002 | Nakamura ...................... | 361/737 |
| 6,624,005 B1 * | 9/2003 | DiCaprio et al. ............. | 438/113 |
| 6,630,622 B2 * | 10/2003 | Konold .......................... | 136/246 |
| 7,359,208 B2 * | 4/2008 | Ni ................................. | 361/752 |
| 7,529,098 B2 * | 5/2009 | Aizawa ......................... | 361/737 |
| 7,855,099 B2 * | 12/2010 | Ni et al. ......................... | 438/106 |
| 7,872,873 B2 * | 1/2011 | Hiew et al. ..................... | 361/737 |
| 2009/0168322 A1 | 7/2009 | Okada | |

FOREIGN PATENT DOCUMENTS

| | | |
|---|---|---|
| JP | 59-40955 | 3/1984 |
| JP | 5-81499 | 4/1993 |
| JP | 05-081499 | 4/1993 |
| JP | 2002-15296 | 1/2002 |
| JP | 2002-015296 | 1/2002 |
| JP | 2007-128959 | 5/2007 |

OTHER PUBLICATIONS

U.S. Appl. No. 12/887,000, filed Sep. 21, 2010, Nishiyama.
U.S. Appl. No. 12/958,750, filed Dec. 2, 2010, Okada.
Office Action issued Jul. 31, 2012, in Japanese Patent Application No. 2009-001881, filed Jan. 7, 2009 (with English-language Translation).
Office Action issued Oct. 30, 2012, in Japanese Patent Application No. 2009-001881, filed Jan. 7, 2009 (with English-language Translation).

* cited by examiner

*Primary Examiner* — Hung S Bui
(74) *Attorney, Agent, or Firm* — Oblon, Spivak, McClelland, Maier & Neustadt, L.L.P.

(57) ABSTRACT

A semiconductor memory card includes a semiconductor memory, a controller, input/output terminals, resistive elements, first wires, and second wires. The semiconductor memory is mounted on one surface of a substrate. The controller is mounted on the other surface of the substrate and controls the semiconductor memory. The input/output terminals input and output signals to and from the semiconductor memory via the controller. The resistive elements electrically connect input/output terminals to the controller. The first wires connect one-side ends of each of the resistive elements to the controller and each of which has a wire length of 4.0 mm or less. The second wires connect the other-side ends of each of the resistive elements to the input/output terminals.

14 Claims, 14 Drawing Sheets

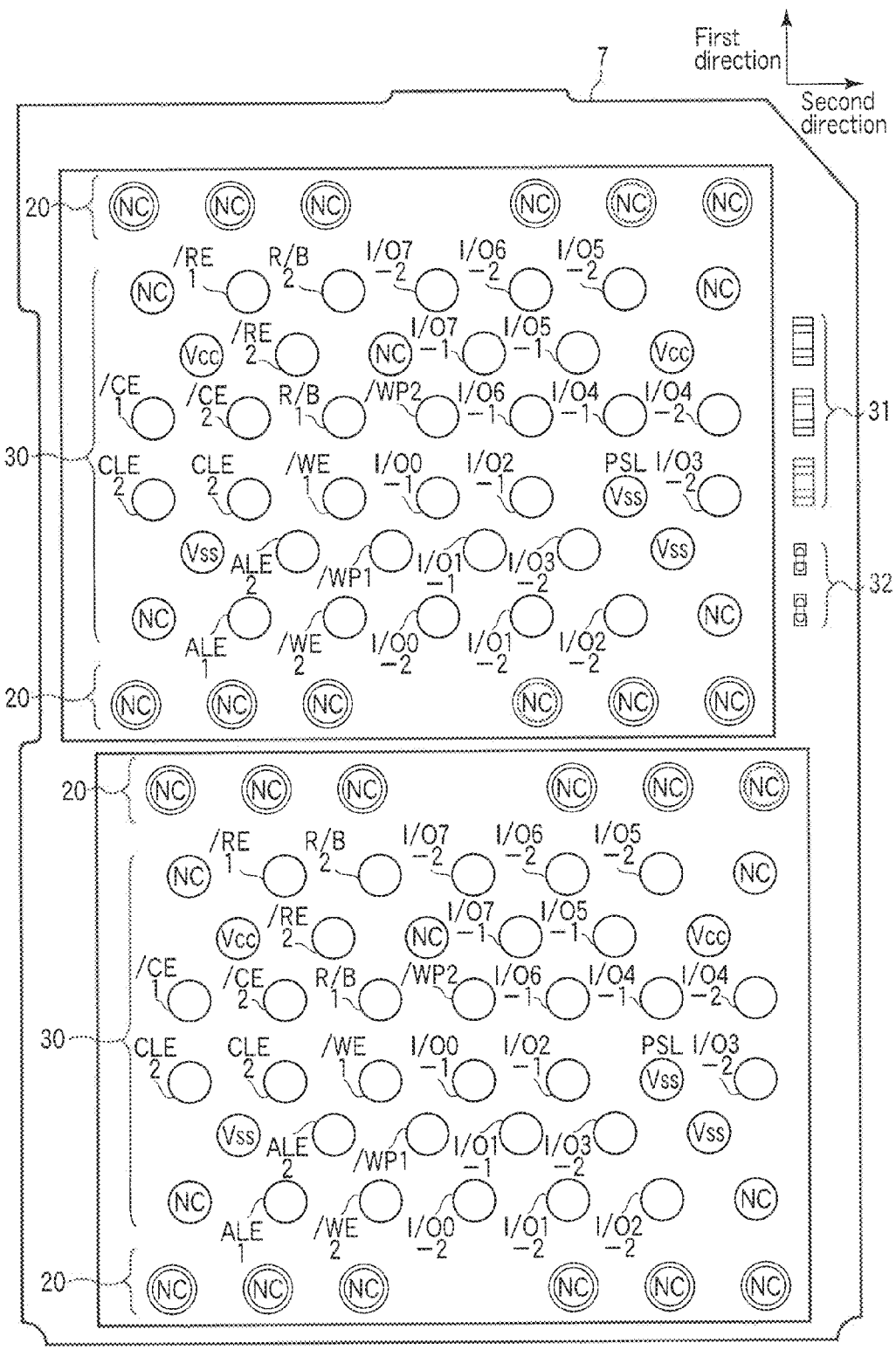
F I G. 6

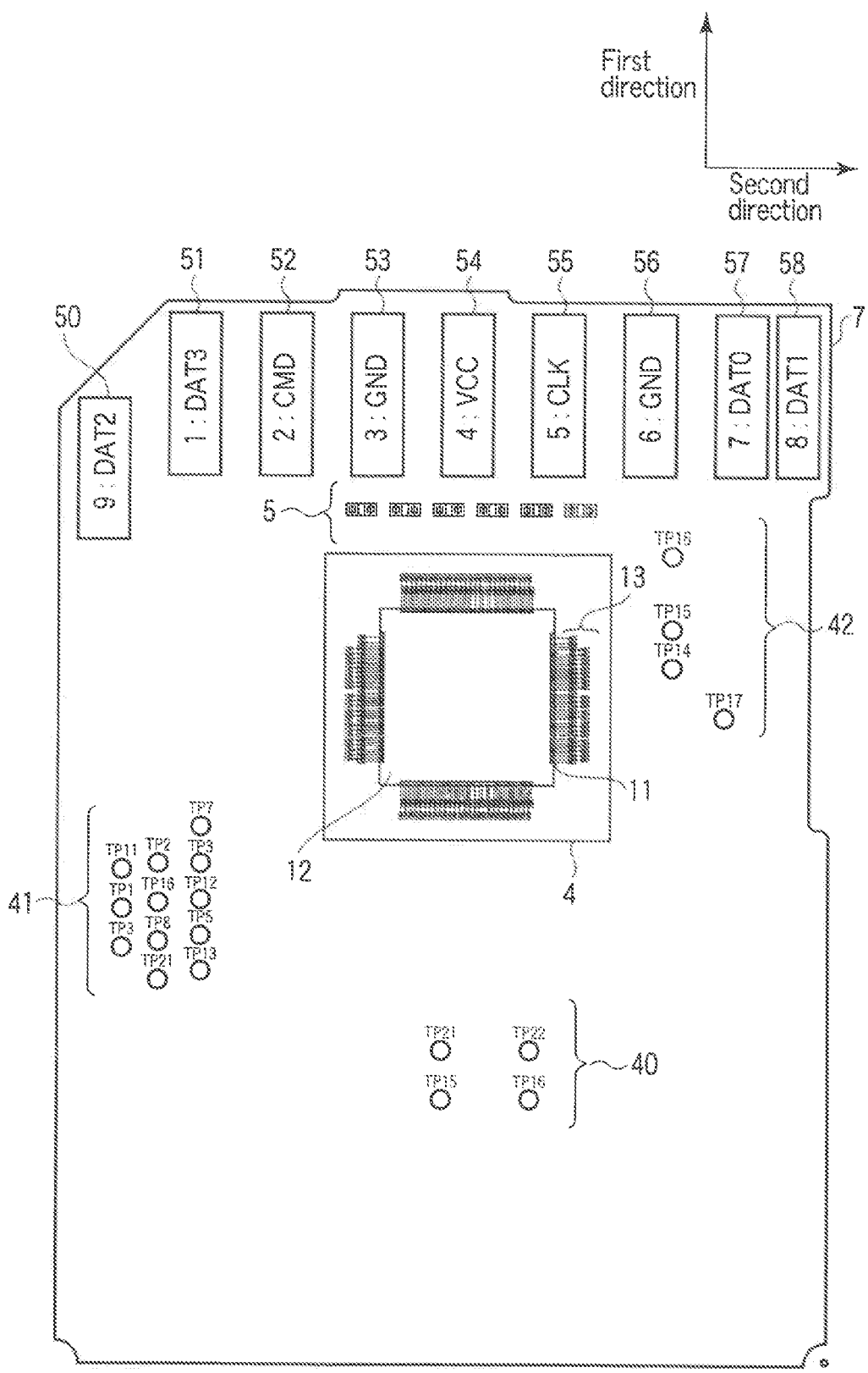
F I G. 7

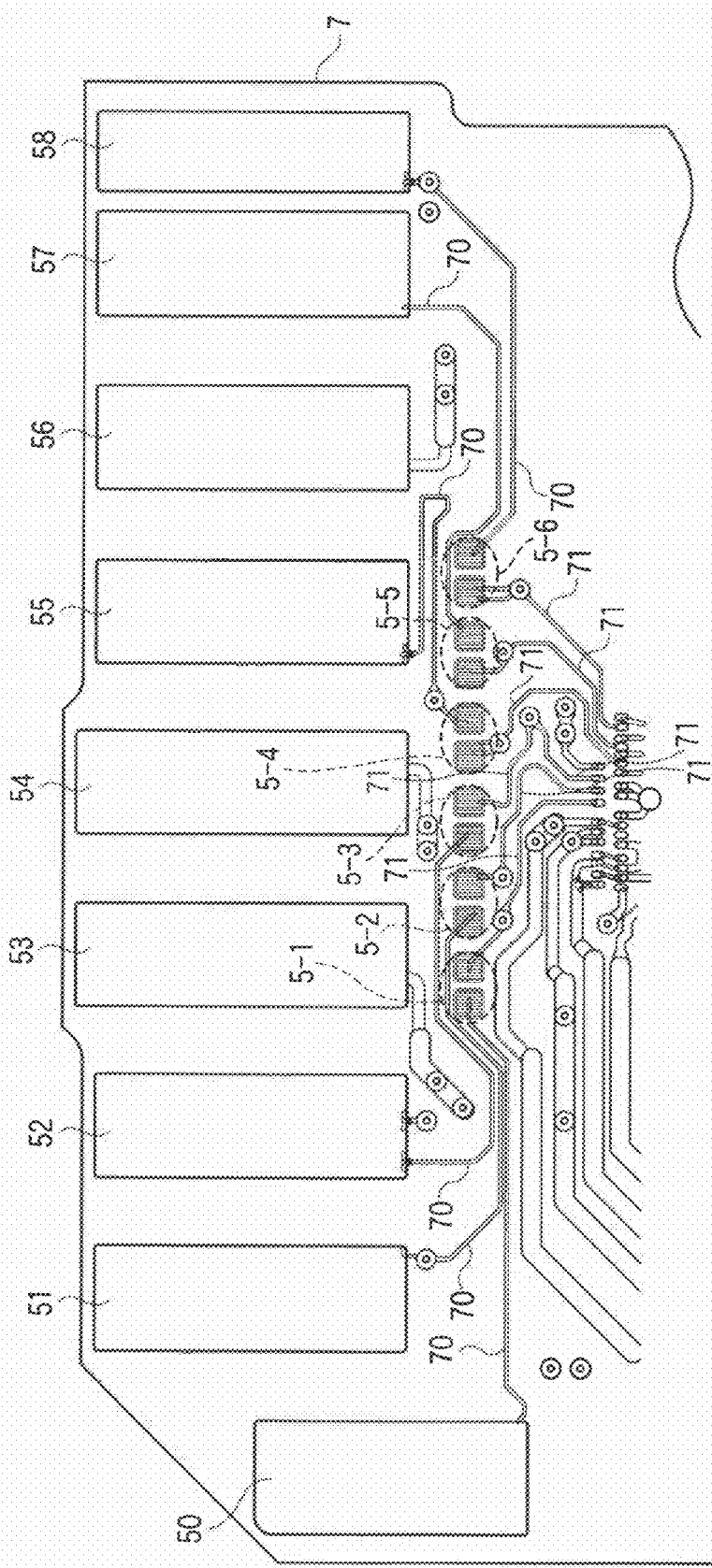
F I G. 9

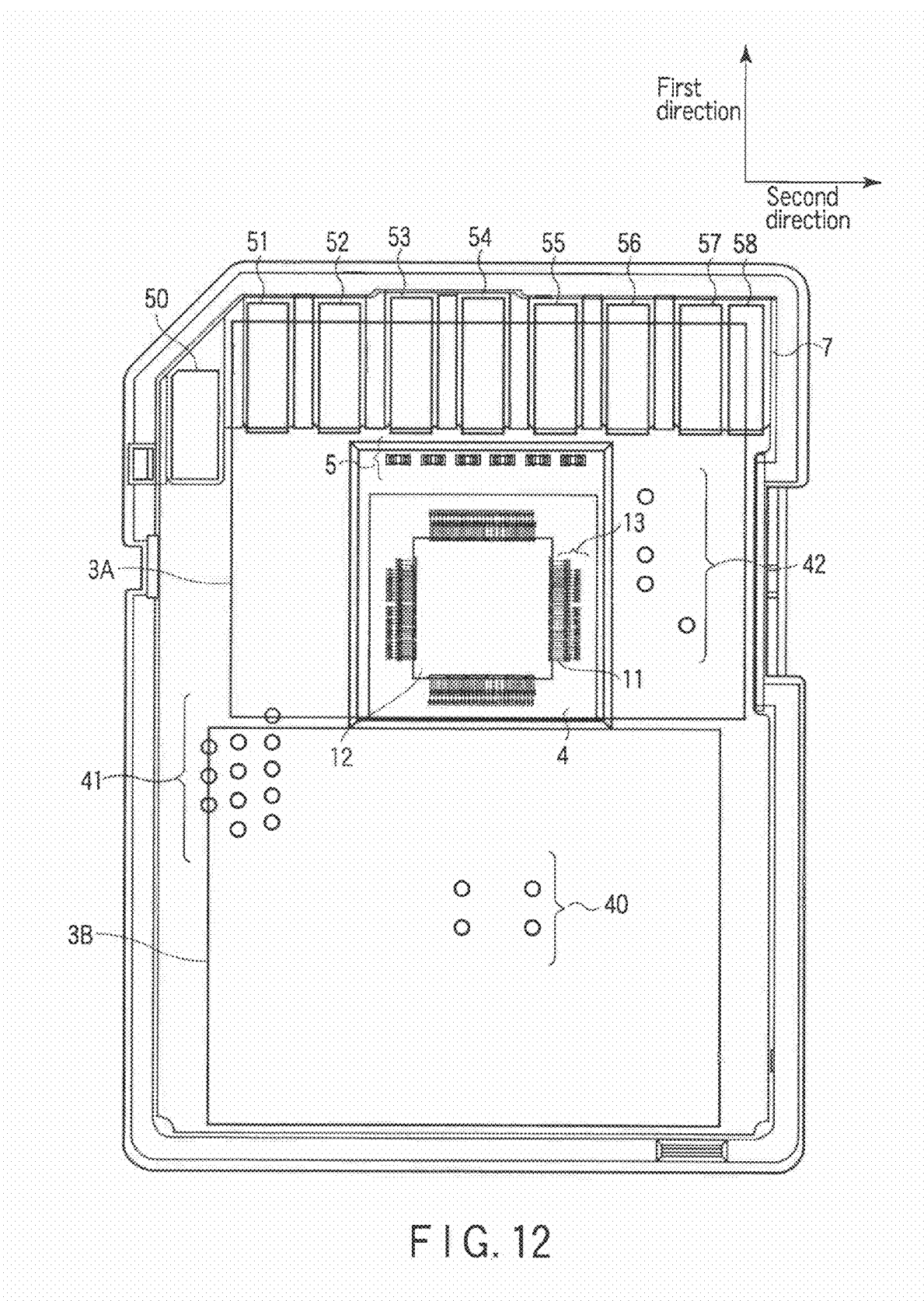
F I G. 12

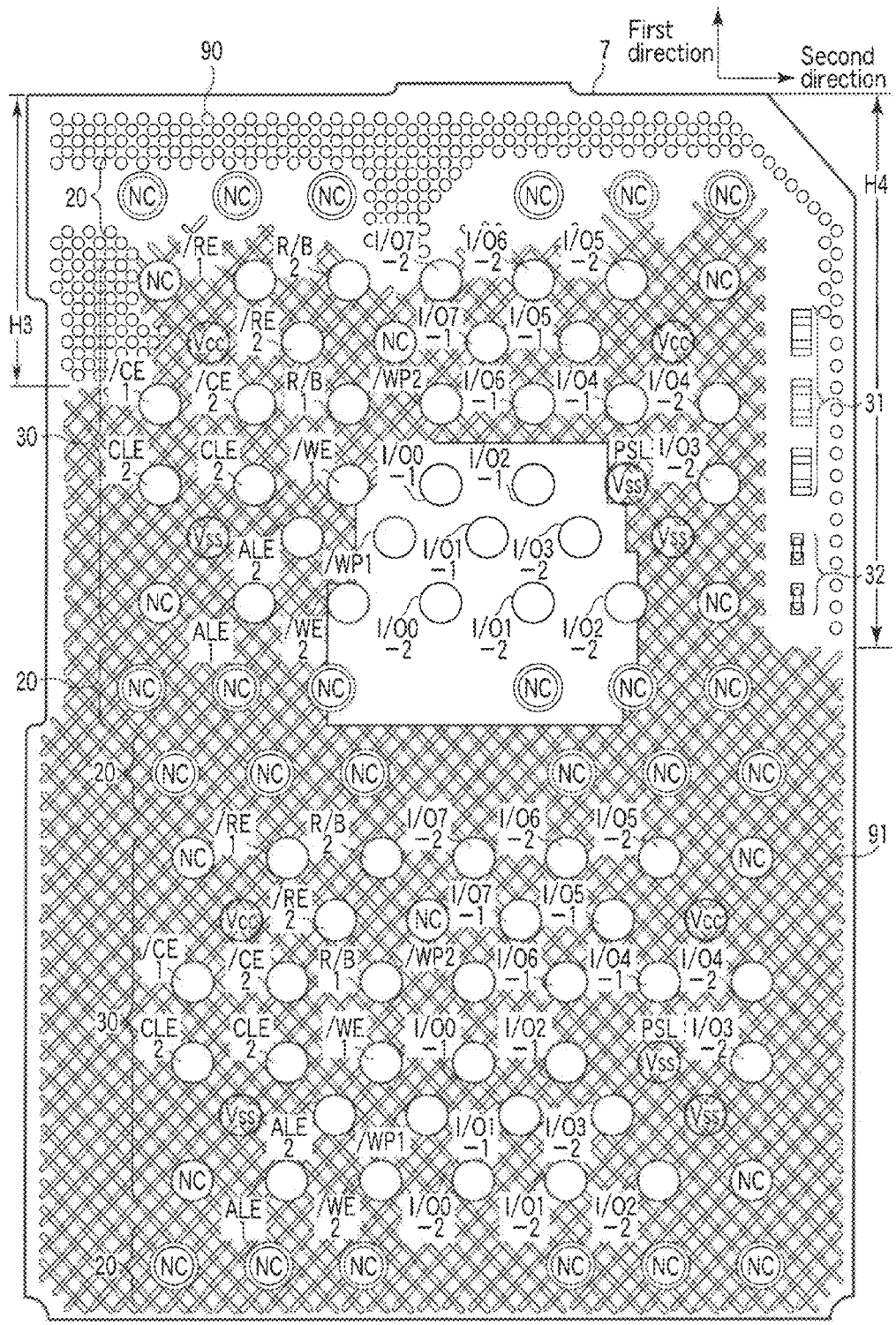
F I G. 14

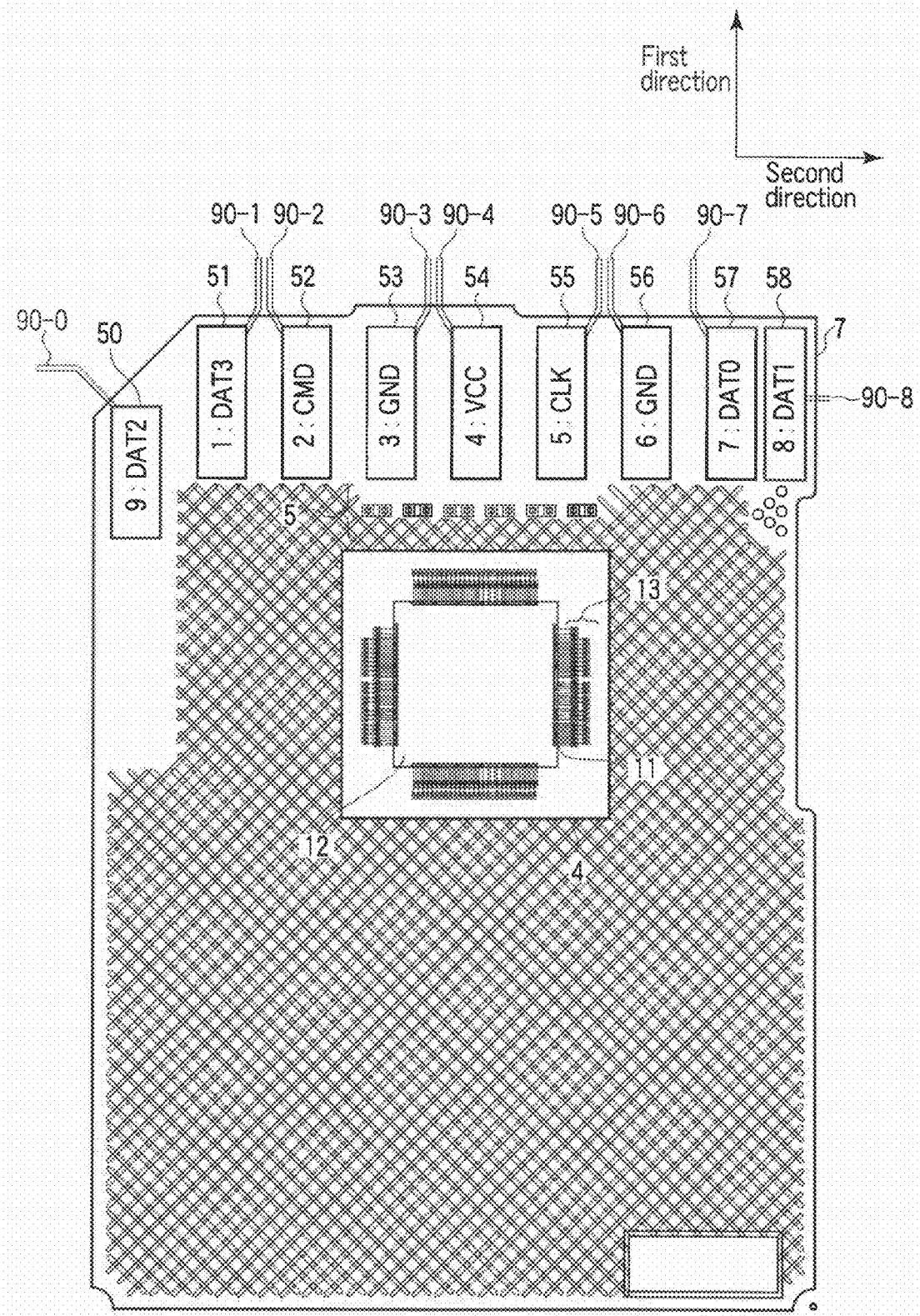
F I G. 15

SEMICONDUCTOR MEMORY CARD WITH CONTROLLER CHIP

CROSS-REFERENCE TO RELATED APPLICATIONS

This application is based upon and claims the benefit of priority from prior Japanese Patent Application No. 2009-001881, filed Jan. 7, 2009, the entire contents of which are incorporated herein by reference.

BACKGROUND OF THE INVENTION

1. Field of the Invention

This invention relates to a semiconductor memory card with a controller chip.

2. Description of the Related Art

With the recent increase in the amount of information, a semiconductor memory, such as a NAND flash memory, has been required to have a higher capacity.

However, a controller chip for controlling a semiconductor memory was often mounted on the same substrate surface as that of the semiconductor memory on a substrate on which a semiconductor memory, such as an SD™ memory card (hereinafter, referred to as an SD card), was mounted, which has been disclosed in Jpn. Pat. Appln. KOKAI Publication No. 2007-128959. Since an area large enough to mount the semiconductor memory could not be secured in the SD card, the memory capacity was increased by densifying the semiconductor memory itself.

BRIEF SUMMARY OF THE INVENTION

A semiconductor memory card according to an aspect of the invention includes, a first semiconductor memory which is mounted on one surface of a substrate;

a controller which is mounted on the other surface of the substrate and which controls the first semiconductor memory;

a plurality of input/output terminals which input and output signals to and from the first semiconductor memory via the controller;

a plurality of resistive elements which electrically connect the plurality of input/output terminals to the controller;

a plurality of first wires which connect one-side ends of each of the plurality of resistive elements to the controller and each of which has a wire length of 4.0 mm or less, and a plurality of second wires which connect the other-side ends of each of the plurality of resistive elements to the input/output terminals.

BRIEF DESCRIPTION OF THE SEVERAL VIEWS OF THE DRAWING

FIG. 6 shows a solder resist aperture pattern in the first embodiment;

FIG. 7 is a plan view of the underside of the package substrate according to the first embodiment;

FIGS. 9 and 10 are enlarged views of FIG. 7;

FIG. 12 is a plan view of the SD card of the first embodiment, viewed from the lower case;

FIGS. 14 and 15 are plan views of an SD card according to a second embodiment of the invention.

DETAILED DESCRIPTION OF THE INVENTION

Figure 1:
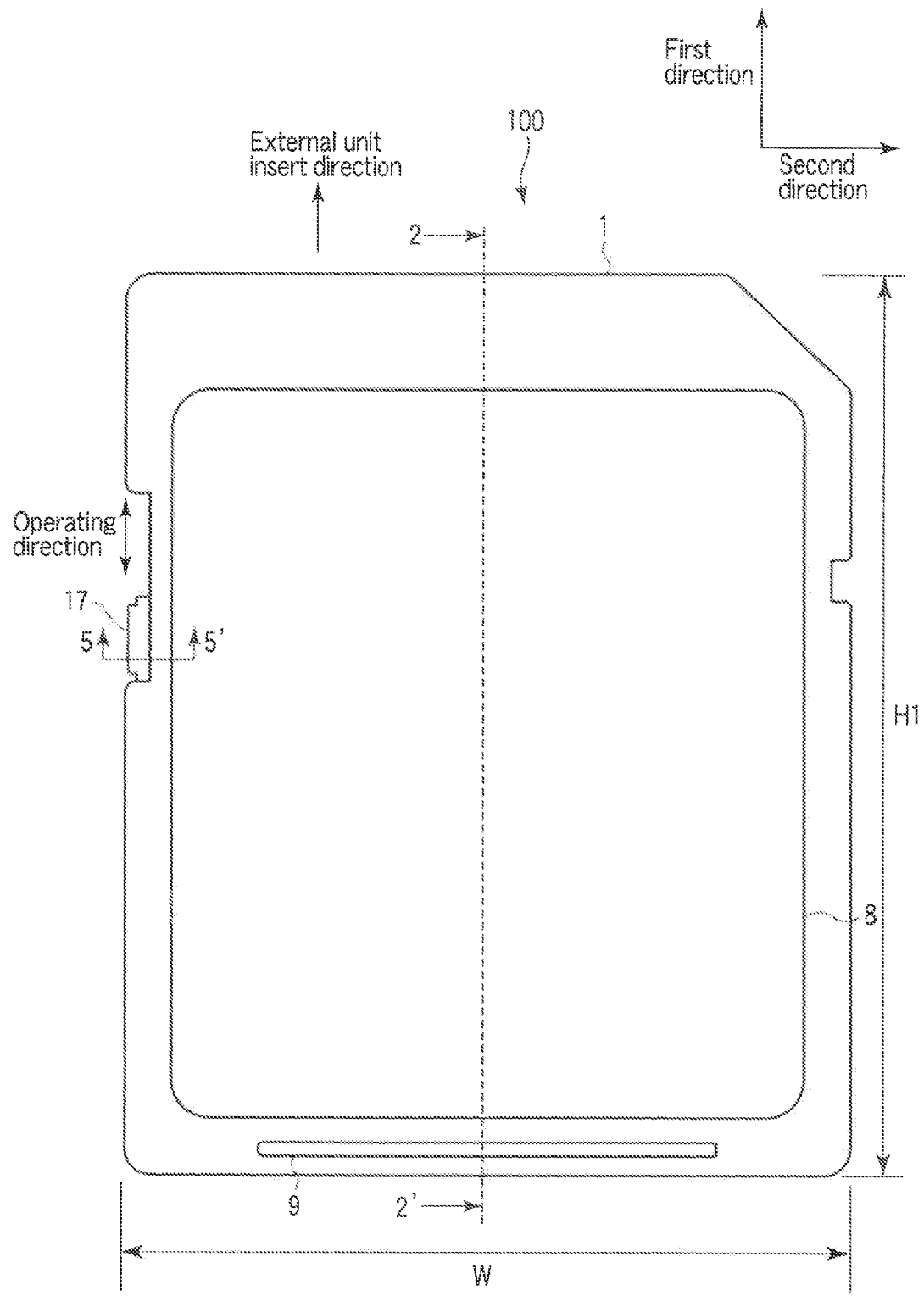
FIG. 1 is a plan view showing an outward appearance of an SD card according to a first embodiment of the invention.

Hereinafter, referring to the accompanying drawings, embodiments of the invention will be explained. In the explanation, the same parts are indicated by the same reference numerals throughout all the drawings.

First Embodiment

A semiconductor memory card according to a first embodiment of the invention will be explained, taking an SD card as an example. FIG. 1 is a plan view showing an outward appearance of the SD card. As shown in FIG. 1, an SD card 100 includes an upper case 1, a label sticking groove part 8, a handle 9, and a write protect switch 17. A first direction in FIG. 1 is a direction in which the SD card 100 is inserted into an external unit (not shown) which exchanges data with the SD card 100.

The label sticking groove part 8 is a part on which a label on which specifications and others of the SD card 100 have been printed is to be stuck.

The handle 9 is a part to be held when the SD card 100 is inserted to electrically connect with an external unit (not shown). The handle 9 is also a part to be held when the SD card 100 is removed from the external unit.

The write protect switch 17 is a switch to be operated to inhibit data from being written to a memory package mounted on the SD card 100. The write protect switch 17 can be switched between the setting and cancellation of the data write protect mode by sliding the switch in an operating direction shown in FIG. 1. For example, in the position of the write protect switch 17 shown in FIG. 1, data is inhibited from being written to the memory package mounted on the SD card 100. The height (indicated as H1 in FIG. 1) of the SD card 100 in a first direction is 32 mm. The height H1 is allowed to have an error of ±1 mm for 32 mm. The width (indicated as W in FIG. 1) of the SD card 100 in a second direction is 24 mm. The width W is allowed to have an error of ±0.1 mm for 24 mm.

Figure 2:
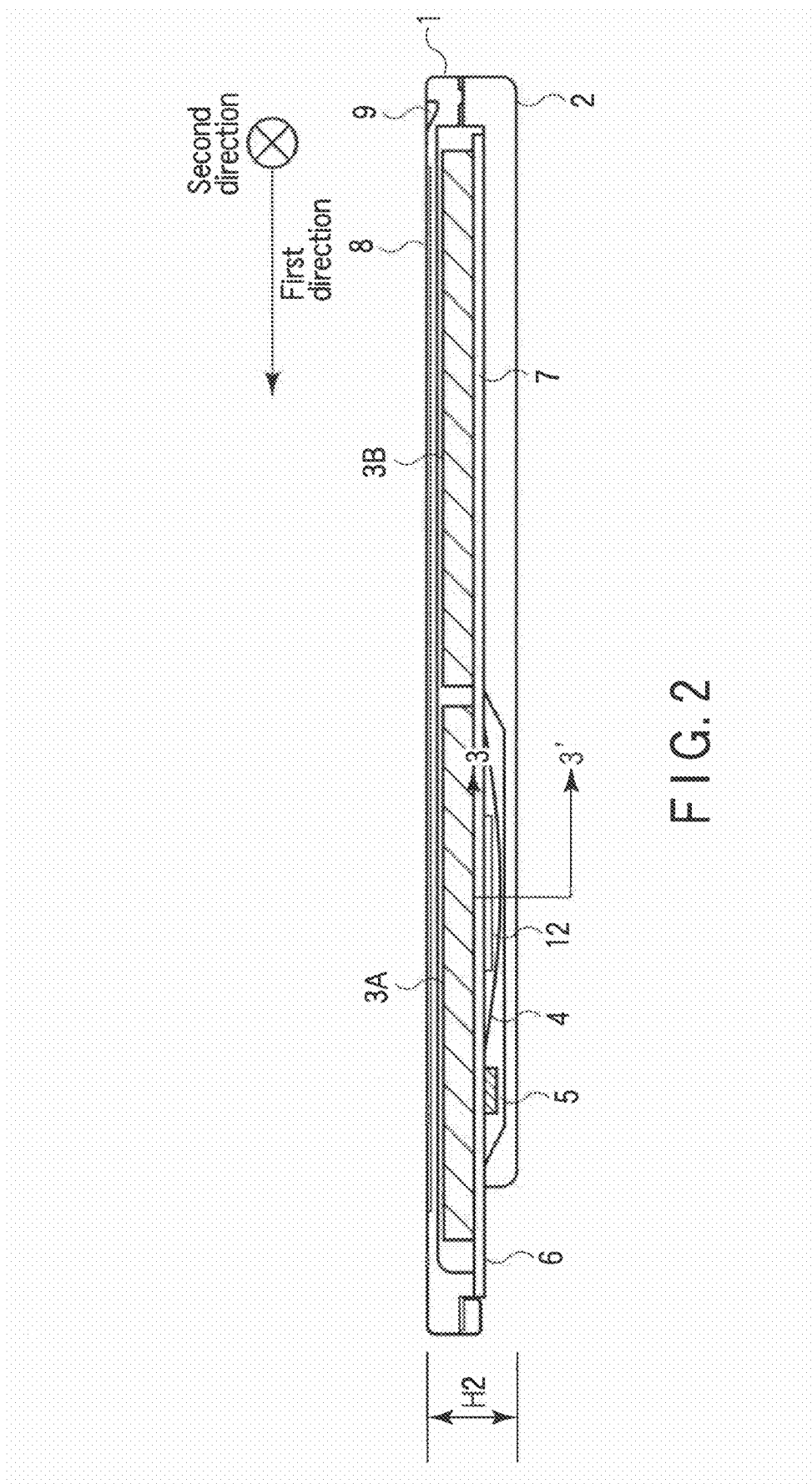
FIG. 2 is a sectional view taken in a 2-2 direction of FIG. 1.

Next, the cross-sectional direction of the SD card 100 in the 2-2 direction of FIG. 1 will be explained with reference to FIG. 2. FIG. 2 is a sectional view of the SD card 100 in the 2-2' direction of FIG. 1. As shown in FIG. 2, the exterior package of the SD card 100 is formed of an upper case 1 and a lower case 2 whose periphery is welded to the upper case 1 and which houses a memory package and a memory controller for controlling the memory package. As shown in FIG. 2, the height (indicated as H2 in FIG. 2) of the SD card 100 armored with the upper case 1 and lower case 2 is 2.1 mm. The height H2 may have an error of ±0.15 mm for 2.1 mm.

In the SD card 100 armored with the upper case 1 and lower case 2, memory packages 3A, 3B made up of, for example, NAND flash memories and a memory controller 12 for controlling the memory packages 3A and 3B are mounted on a circuit board 7. Specifically, on the upper surface of the circuit board 7, that is, on the upper case 1 side, the memory packages 3A, 3B are mounted. On the underside of the circuit board 7, that is, the lower case 2 side, the memory controller 12 for controlling the memory packages 3A, 3B is mounted just under the memory package 3A. Resin potting 4 is formed around the memory controller 12 so as to protect the controller 12. In FIG. 2, at the lower tip part of the upper case in the first direction, there is provided a terminal unit 6 which is electrically connected to an external unit (not shown) and is used to input and output data in the memory packages 3A, 3B. With this configuration, the data in the memory packages 3A, 3B is exchanged with the external unit via the memory controller 12 and terminal unit 6. A plurality of resistive elements (hereinafter, referred to as a resistive element group 5) are formed between the memory controller 12 and the terminal unit 6 and on the underside of the circuit board 7. The resistance value of each of the resistive elements 5 is several tens or several hundreds of ohms [Ω].

Figure 3:
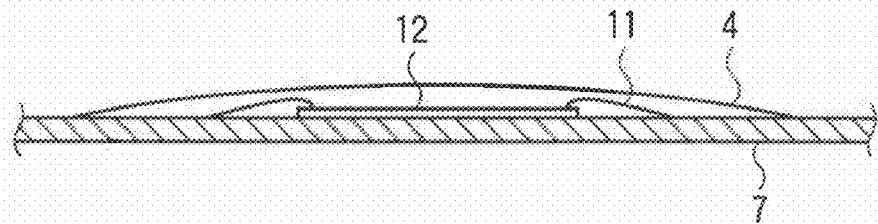
FIG. 3 is a sectional view taken along line 3-3' of FIG. 2.

Next, the cross section taken along line 3-3' of FIG. 2 will be explained with reference to FIG. 3. FIG. 3 is a sectional view of the memory package 3A and memory controller 12 mounted on the circuit board 7. As shown in FIG. 3, the memory controller 12 is formed on the surface of the circuit board 7 and bonding wires 11 are formed so as to electrically connect an electrode pad (not shown) formed at the peripheral part of the surface of the memory controller 12 with metal strips (hereinafter, referred to as bonding fingers) (not shown) formed on the circuit board 7. As described above, the resin potting 4 for protecting the memory controller 12 and bonding wires 11 is formed so as to weld their surrounding part to seal them.

Figure 4:
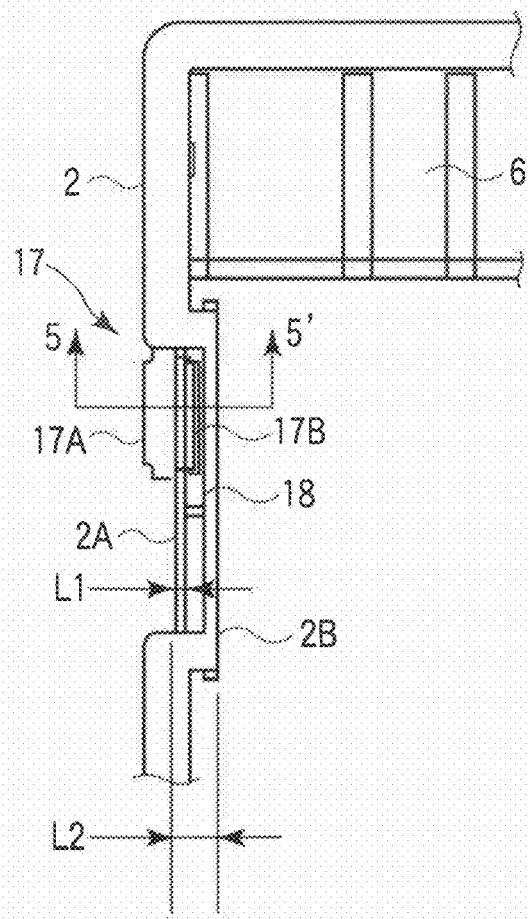
FIG. 4 is an enlarged plan view of a write protect switch, showing a part of the lower case of the SD card of the first embodiment.

FIG. 4 is an enlarged view of the write protect switch 17 of the SD card 100 of FIG. 1, showing a part of the internal configuration of the lower case 2. As shown in FIG. 4, the write protect switch 17 includes an operation unit 17A and a switch body 17B that slides along the inner face of the lower case 2 according to the movement of the operation unit 17A. At the bottom face between an outer-wall rib 2A and an inner-wall rib 2B of the lower case 2, a switch actuating protrusion 18 is provided. The outer-wall rib 2A is a strut (or stopper) provided on the lower case 2 to house the switch body 17B in using the write protect switch 17. The inner-wall rib 2B is an surrounding wall which has a height necessary to house the memory controller 12 and others and which is welded to the upper case 1.

The switch actuating protrusion 18 is arranged so as to cause the switch body 17B to have drag in sliding the operation unit 17A of the write protect switch 17. Accordingly, the write protect switch 17 does not slide unless a certain magnitude of power (e.g., about 1 to 4N) is applied to the operation unit 17A. That is, the switch actuating protrusion 18 is provided to carry out a switching operation reliably in setting or canceling the write protect mode.

Suppose the thickness of the outer-wall rib 2A on the side of the lower case 2 which houses the switch body 17B is about 0.25 mm. The distance L2 from the outer-wall rib 2A which houses the write protect switch 17 to the inner wall 2B is assumed to be about 2.4 mm. The write protect switch 17 is housed so as not to protrude outside the lower case 2 when being housed in a concave region of the SD card 100 as shown in FIGS. 1 and 4.

Figure 5:
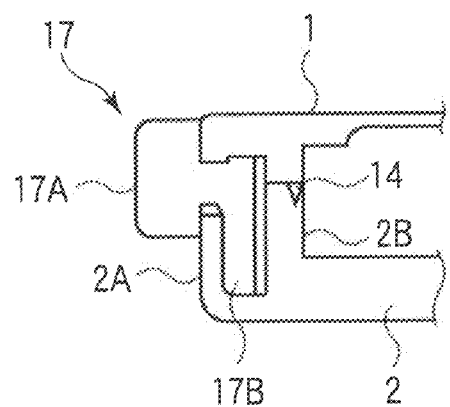
FIG. 5 is a sectional view taken along line 5-5' of FIG. 1.

Next, a cross section of the write protect switch 17 of FIG. 4 is shown in FIG. 5. FIG. 5 is a sectional view of the write protect switch 17 taken along line 5-5' of FIG. 1. As shown in FIG. 5, the switch body 17B is housed between the outer-wall rib 2A and the inner-wall rib 2B. A welding protrusion 14 (or energy director) which welds the upper case 1 and lower case 2 together is provided on the entire peripheral part inside the upper case 1.

FIG. 6 is a plan view when the circuit board 7 of FIG. 2 is viewed from the upper case 1. FIG. 6 shows a configuration of a solder resist aperture pattern of the mounting surface of each of the memory packages 3A, 3B on the circuit board 7. As shown in FIG. 6, on the mounting surface of the circuit board 7 on which the memory packages 3A, 3B have been mounted, solder resist aperture patterns 20, 30 are formed so as to align with the positions of the individual solder connection terminals of the memory packages 3A, 3B. That is, on the solder resist aperture patterns 20, 30, there are provided mounting pads which solder-connect the memory packages 3A, 3B with the circuit board 7 to connect them electrically.

In the first embodiment, however, the solder resist aperture pattern 20 is for stabilizing the memory packages 3A, 3B mounted on the circuit board 7. That is, the individual terminals of the solder resist aperture pattern 20 are dummy terminals connected to nothing (indicated as NC). Accordingly, data and signals are not exchanged between the external unit and the memory packages 3A, 3B mounted on the circuit board 7 by using the solder resist aperture pattern 20.

That is, a plurality of aperture patterns constituting the solder resist aperture pattern 30 are connected to the external unit via the memory controller 12. Specifically, the solder resist aperture pattern 30 includes input/output terminals (indicated as I/O0 to I/O7 in FIG. 6), a read enable terminal (indicated as RE in FIG. 6), a write enable terminal (indicated as WE in FIG. 6), a command latch enable terminal (indicated as CLE in FIG. 6), an address latch enable terminal (indicated as ALE in FIG. 6), a ready/busy terminal (indicated as R/B in FIG. 6), a chip enable terminal (indicated as CE in FIG. 6), a write protect terminal (indicated as WP in FIG. 6), a Vss terminal (indicated as Vss in FIG. 6), a Vcc terminal (indicated as Vcc in FIG. 6), and dummy terminals (indicated as NC in FIG. 6).

The input/output terminals exchange commands, addresses, and data with the external unit (not shown).

The read enable terminal outputs a signal that makes it possible to read data from the memory packages 3A, 3B.

The write enable terminal outputs a signal that makes it possible to write the data from the external unit (not shown) to the memory packages 3A, 3B.

The command latch enable terminal outputs a signal used in temporarily latching a command from the input/output terminal in a command register. Specifically, by making the signal high at the time when the write enable signal rises, the data at the input/output terminals are loaded into the command register.

The address latch enable terminal outputs a signal used in temporarily latching an address from the input/output terminals in an address register. Specifically, by making the signal high at the time when the write enable signal rises, the address at the input/output terminal is loaded into the address register.

The ready busy terminal outputs a signal for reporting the operating state of the memory packages 3A, 3B. When the memory packages 3A, 3B are in a program operation, an erase operation, or a read operation, the ready busy terminal outputs a busy signal (at the low level). When the memory packages 3A, 3B have completed the operation, the ready busy terminal goes into a ready state (at the high level).

The chip enable terminal outputs a signal for enabling the memory packages 3A, 3B.

The write protect terminal outputs a signal used to protect data from an unexpected erasing or writing when the input signal is undetermined, such as when the power supply is turned on or off.

The Vcc terminal outputs an internal power supply for operating the SD card 100.

The Vss terminal, which is, for example, a grounded terminal, outputs 0 V to the SD card 100. The solder resist aperture pattern 30 is also provided with a dummy terminal. This dummy terminal exchanges neither data nor a signal.

The memory packages 3A, 3B can input and output data and signals using two channels. That is, the memory packages 3A, 3B can use either channel 1 or channel 2, depending on the need. As shown in FIG. 6, a terminal that inputs and outputs data and a signal using channel 1 is indicated as "1." Similarly, a terminal that inputs and outputs data and a signal using channel 2 is indicated as "2."

On the circuit board 7, fuse elements 31 and capacitor elements 32 are formed in a second direction.

FIG. 7 is a plan view of the back side of the circuit board 7, that is, the circuit board 7 viewed from the lower case 2. As shown in FIG. 7, on the back side of the circuit board 7, there are provided a memory controller 12, a plurality of test pad groups 40, 41, 42, a resistive element group 5, and gold terminal patterns 50 to 58. As described above, as many bonding wires 11 as equal the number of data items to be exchanged are formed from a plurality of electrode pads formed on the surface of the memory controller 12 to the bonding fingers 13. As described above, the resin potting 4 is formed so as to protect the memory controller 12, bonding fingers 13 and bonding wires 11.

As shown in FIG. 7, the gold terminal patterns 50 to 58 are formed so as to correspond to the pin arrangement of the terminal unit 6 explained in FIG. 2. The gold terminal patterns 50 correspond to DAT (data) 2 pin (ninth pin), gold terminal pattern 51 to DAT 3 pin (first pin), gold terminal pattern 52 to CMD (command) pin (second pin), gold terminal pattern 53 to GND pin (third pin), gold terminal pattern 54 to VCC pin (fourth pin), gold terminal pattern 55 to CLK (clock) pin (fifth pin), gold terminal pattern 56 to GND pin (sixth pin), gold terminal pattern 57 to DATA0 pin (seventh pin), and gold terminal pattern 58 to DAT1 pin (eighth pin). When there is no need to distinguish between them, they will simply be referred to as the gold terminal patterns.

The resistive group 5 is formed in the area between the gold terminal patterns 50-58 and the memory controller 12. With this structure, when data (signals) entered from an external device (not shown) is transmitted to wire 70 (to be described later) by way of gold terminal patterns 50-58, the signals are prevented from being reflected by the wire 70. Likewise, when data (a voltage signal of a certain amplitude) supplied from the memory packages 3A and 3B to the external device (not shown) by way of the memory controller 12 passes through wire 71, the data is prevented from being reflected by the wire 71. In other words, the resistive group 5 has the function of preventing data reflection when data is output from the external device (not shown) or input thereto, i.e., the function of terminating the data at the resistive group 5. As can be understood from this, the resistive group 5 is arranged at such a position as permits the data transmitted through the wires 70 and 71 and having amplitude of the noise by reflection serves to become minimum at the resistive group 5. The reason for employing this structure is that the consumption power of data caused by the data reflection at the terminating end of the resistive group 5 changes in proportion to the square of the amplitude. This is why the resistive group 5 is arranged at a position that satisfies the above condition.

The resistive group 5 is composed of six resistive elements. This is because the data exchange between the external unit (not shown) and the memory packages 3A, 3B is performed using a total of six gold terminal patterns 50 to 52, 55, 57, and 58. That is, the gold terminal patterns 50 to 52, 55, 57, and 58 are electrically connected to the resistive element group 5 with wires in a one-to-one correspondence. In addition, the resistive element group 5 is connected electrically to any one of the plurality of bonding fingers 13 arranged on the memory controller side with wires of the same length.

Figure 8:
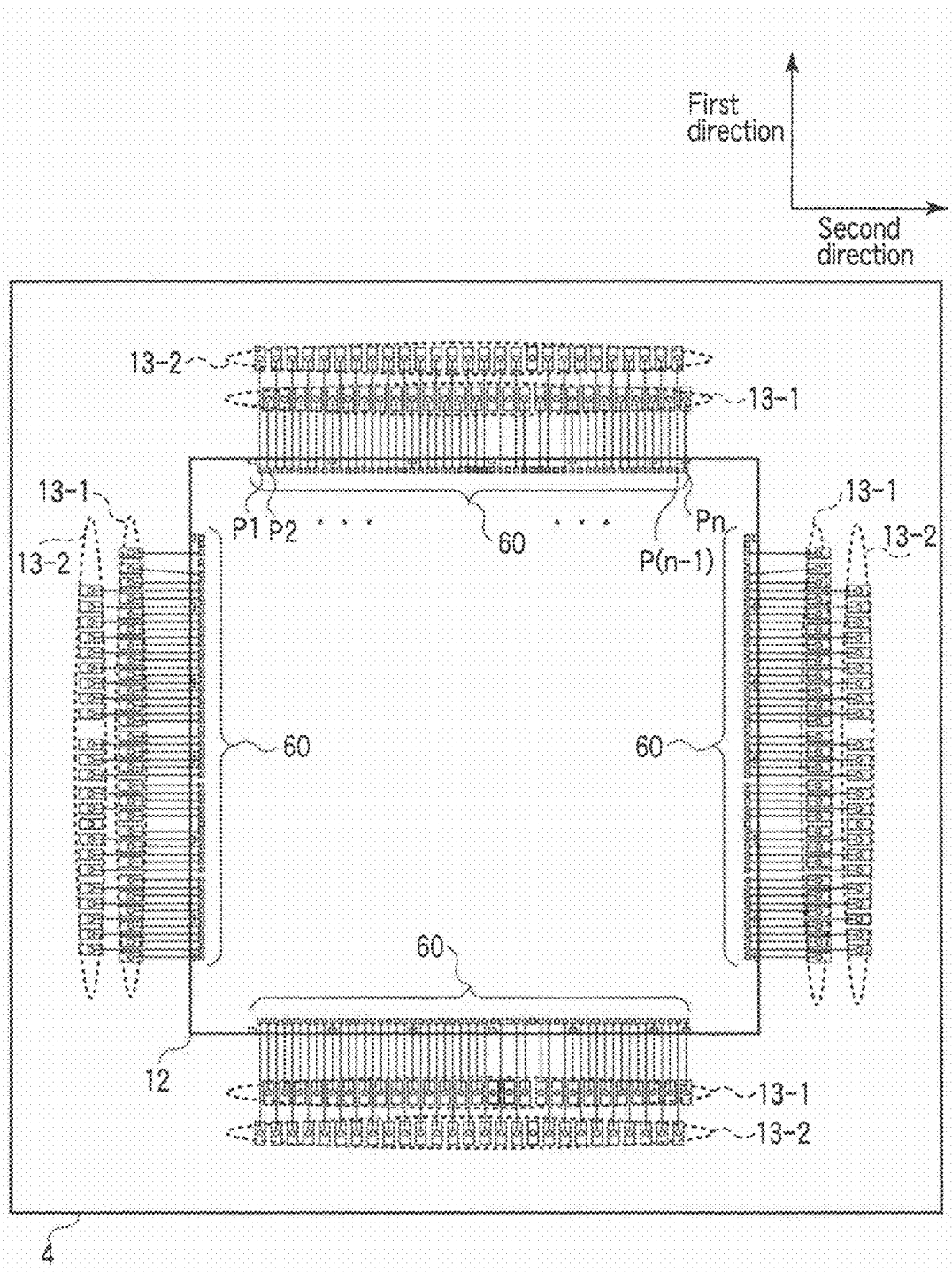
FIG. 8 is an enlarged view of the memory controller of FIG. 7.

FIG. 8 is an enlarged view of the memory controller 12. As shown in FIG. 8, on the surface of the memory controller 12, there are provided a plurality of electrode pads P1 to Pn (n is, for example, an even natural number) to be connected to the circuit board 7. Hereinafter, there is no need to distinguish between them, they will simply be referred to as the electrode pads P. The electrode pads P are provided along the periphery of the memory controller 12. A plurality of electrode pads P arranged in a line is referred to collectively as an electrode pad group 60. Around the memory controller 12 and bonding fingers 13-1, 13-2, a region where the resin potting 4 is to be formed is shown.

Each of the bonding fingers 13 is an electrode made of metal. The bonding fingers 13 are arranged so as to surround the area where the memory controller 12 is provided. The bonding fingers 13 are connected to the electrode pads P of the memory controller 12 with, for example, the bonding wires 11 at the time of packaging.

In the first embodiment, for example, the bonding fingers 13 are arranged in a double line as shown in FIG. 8. Specifically, a part of the bonding fingers 13 are arranged in a line on the inside and the rest are arranged in a line on the outside. The bonding fingers 13 arranged closer to the memory controller 12 are referred to as bonding fingers 13-1. The bonding fingers 13 arranged not closer to the memory controller 12 are referred to as bonding fingers 13-2. The bonding fingers 13-2 are connected to electrode pads P1, P3, . . . , P(n−1) in a one-to-one correspondence, the bonding fingers 13-1 are connected to electrode pads P2, P4, . . . , P(n) in a one-to-one correspondence.

Accordingly, the bonding fingers 13-2 and the bonding fingers 13-1 formed medial to the bonding fingers 13-2 are formed alternately. Adjacent bonding fingers 13-2 are formed at such minimum intervals as allow wires connected to the bonding fingers 13-1 to pass through.

Two or more bonding fingers 13-1 arranged on the inside may be provided for the bonding fingers 13-2 arranged on the outside. In this case, the distance between adjacent bonding fingers 13-2 is such that bonding wires 11 connecting adjacent bonding fingers 13-2 to the electrode pads P corresponding to the bonding fingers 13-2 sandwich bonding fingers 13-1 arranged on the inside between them and pass outside the bonding fingers 13-1.

FIG. 9 is an enlarged view of FIG. 7. FIG. 9 particularly shows the way the gold terminal patterns, resistive element group 5, bonding fingers 13 formed on the circuit board 7 are connected electrically with wires. The six resistive elements included in the resistive element group are referred to as resistive elements 5-1 to 5-6.

As shown in FIG. 9, gold terminal pattern 50 is connected to resistive element 5-1 with wire 70, gold terminal pattern 51 to resistive element 5-2 with wire 70, gold terminal pattern 52 to resistive element 5-3 with wire 70, gold terminal pattern 55 to resistive element 5-4 with wire 70, gold terminal pattern 57 to resistive element 5-5' with wire 70, and gold terminal pattern 58 to resistive element 5-6 with wire 70. Resistive elements 5-1 to 5-6 are connected to the bonding fingers 13 with wires 71. With this connection, various items of data transferred from the gold terminal patterns are transferred to the memory controller 12.

Of the gold terminal patterns 50 to 58, data is input to and output from the memory controller 12 through the gold terminal patterns 50 to 52, 55, 57, 58. Specifically, data is transferred to, for example, NAND flash memories constituting the memory packages 3A, 3B through the gold terminal patterns 50, 51, 57, 58.

Moreover, the gold terminal pattern 52 enables a command to be exchanged. On the basis of the command, the sequence of the operation of writing, reading, or erasing the transferred data is executed. To execute the sequence, the operation of each circuit block included in the memory packages 3A, 3B is controlled. Clock CLK is transferred from the gold terminal pattern 55 to the memory controller 12. On the basis of clock CLK, the operation sequence is executed.

The gold terminal pattern 54 supplies a voltage to the entire SD card.

The resistive element group 5 takes such a form as has metal terminals on both sides of a resistor material made of, for example, ceramic. That is, the one-side ends of resistive elements 5-1 to 5-6 are connected to the metal terminal patterns with wires 70. The other-side ends of resistive elements 5-1 to 6-5 are connected to the bonding fingers 13 with wires 71.

That is, there are provided six wires 70 that connect the resistive elements 5-1 to 5-6 to the bonding fingers 13. The length of each of the six wires 71 is 4.0 mm or less. Moreover, the six wires 71 are laid with an error of 5% or less of the average of the wire lengths of the wires 71. That is, the wires 71 have almost the same wire length.

In each of the signal paths extending from the gold terminal patterns 50 to 52, 55, 57, and 58 to the bonding fingers 13 via resistive elements 5, the sum of the lengths of wires 70 and 71 is 10.0 mm or less. Moreover, the wires 70, 71 are laid with an error of 5% or less of the average of the sum of the lengths of wires 70, 71. That is, the signal paths extending from the gold terminal patterns 50 to 52, 55, 57, and 58 to the bonding fingers 13 via resistive elements 5 are all made equal.

More specifically, the sum of the length of wire 70 connecting gold terminal pattern 50 and resistive element 5-1 and the length of wire 71 connecting resistive element 5-1 and bonding finger 13, the sum of the length of wire 70 connecting gold terminal pattern 51 and resistive element 5-2 and the length of wire 71 connecting resistive element 5-2 and bonding finger 13, the sum of the length of wire 70 connecting gold terminal pattern 52 and resistive element 5-3 and the length of wire 71 connecting resistive element 5-3 and bonding finger 13, the sum of the length of wire 70 connecting gold terminal pattern 55 and resistive element 5-4 and the length of wire 71 connecting resistive element 5-4 and bonding finger 13, the sum of the length of wire 70 connecting gold terminal pattern 57 and resistive element 5-5' and the length of wire 71 connecting resistive element 5-5' and bonding finger 13, and the sum of the length of wire 70 connecting gold terminal pattern 58 and resistive element 5-6 and the length of wire 71 connecting resistive element 5-6 and bonding finger 13 are almost the same, 10.0 mm or less.

This is because the memory controller 12 is provided near the gold terminal patterns and each of the wires 70, 71 is formed on the same surface, that is, on the circuit board 7.

Figure 10:
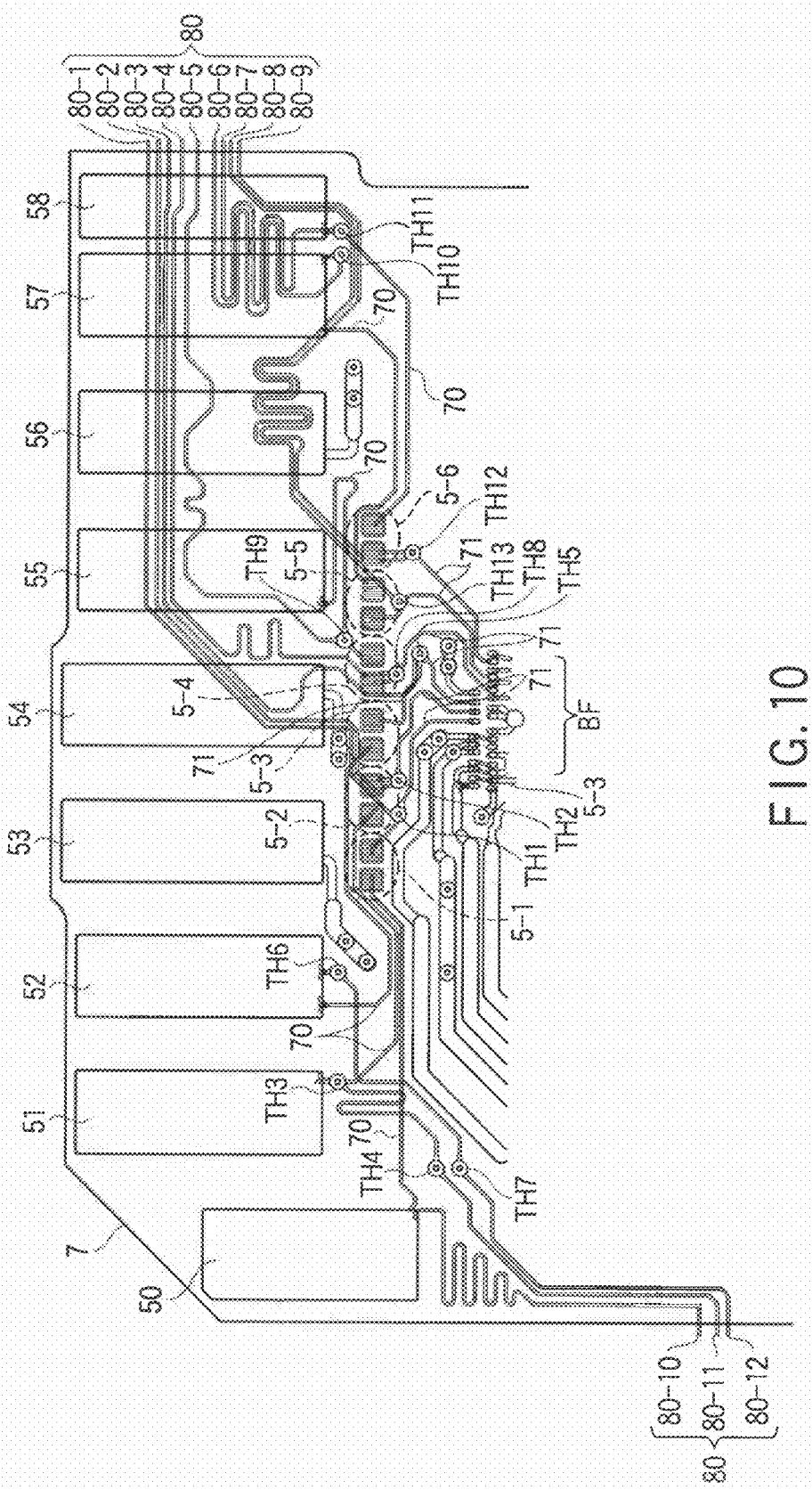

FIG. 10 shows plating lead wires for electrolytically plating gold terminal patterns. The plating lead wires 80 shown in FIG. 10 include 12 plating lead wires 80-1 to 80-12. The plating lead wires 80 are used as electric supply lines for externally supplying a voltage when gold terminal patterns are formed on the circuit board 7. That is, electrolytic plating to plate gold terminal patterns with gold is used by applying a voltage to the gold terminal patterns. Here, in particular, a case where plating lead wires 80-1 to 80-12 connected to DAT (first, seventh, eighth, and ninth pins), CMD (second pin), and CLK (fifth pin) will be explained. The plating lead wires 80 are connected to the gold terminal patterns 50 to 52, 54, 55, 57, 58 via the corresponding through holes TH1 to TH13.

As shown in FIG. 10, plating lead wire 80-1 is electrically connected to one end of resistive element 5-1 via through-hole TH1. One end of plating lead wire 80-10 is connected to gold terminal pattern 50 and the other end of memory lead wire 80-10 is arranged so as to face the peripheral part of the SD card 100.

Plating lead wire 80-2 is electrically connected to one end of resistive element 5-2 via through-hole TH2. One end of plating lead wire 80-11 is connected to gold terminal pattern 51 and the other end of plating lead wire 80-11 is arranged so as to face the peripheral part of the SD card 100. Plating lead wire 80-3 is connected to through-hole TH5. Then, plating lead wire 80-3 is electrically connected to one end of resistive element 5-3 via through-hole TH5. One end of plating lead wire 80-12 is connected to gold terminal pattern 52 and the other end of plating lead wire 80-12 is arranged so as to face the peripheral part of the SD card 100. Plating lead wire 80-4 is electrically connected to one end of resistive element 5-4. One end of plating lead wire 80-5 is connected to the other end of resistive element 5-4 via through-hole TH9 and the other end of plating lead wire 80-5 is arranged so as to face the outside of the SD card 100. Plating lead wire 80-6 is connected to gold terminal pattern 57 via through-hole TH10. One end of plating lead wire 80-8 is connected to one end of resistive element 5-5' via through-hole TH13 and the other end of plating lead wire 80-8 is arranged so as to face the peripheral part of the SD card 100. Plating lead wire 80-7 is connected to gold terminal pattern 58 via through-hole TH11. One end of plating lead wire 80-9 is connected to resistive element 5-6 and the other end of plating lead wire 80-9 is arranged so as to face the peripheral part of the SD card 100.

Then, plating lead wires 80-1 to 80-12 apply external voltages to gold terminal patterns 50 to 52, 55, 56, 57, 58. As a result, gold terminal patterns 50 to 52, 55, 56, 57, 58 are plated by electrolytic plating through plating lead wires 80-1 to 80-12. As described above, plating lead wires 80-1 to 80-12 are arranged so as to face the peripheral part of SD card 100. This is because the transmission paths through which the external voltage is applied artificially after gold terminal patterns 50 to 58 are plated by electrolytic plating. That is, FIG. 10 shows a state where the one-side ends of plating lead wires 80-1 to 80-12 are left outside the circuit board 7. In this case, the length of each of plating lead wires 80-1 to 80-12 is made almost the same.

Actually, GND (third and sixth pin) and VCC (fourth pin) are externally powered, and their plating lead wires (not shown) exist. The voltages may be applied to the plating lead wires without using through-holes TH.

Figure 11:
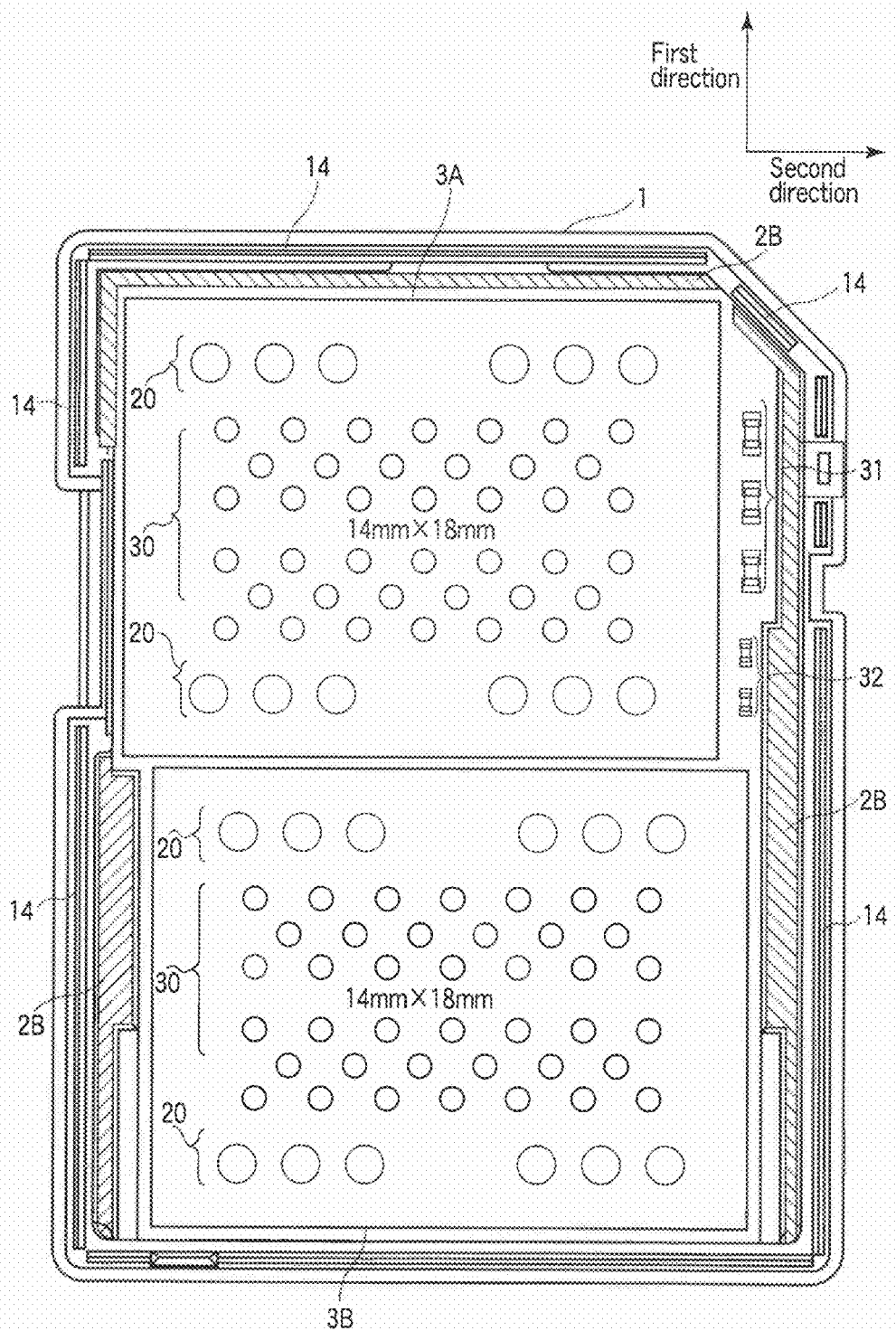
FIG. 11 is a plan view of the SD card of the first embodiment, viewed from the upper case.

FIG. 11 shows a case where LGA (Land grid array) memory packages 3A, 3B are mounted on the circuit board 7 provided on the lower case 2 and the upper case 1 covers the packages and has its periphery welded to that of the lower case 2. FIG. 11 is a perspective view when SD card 100 is viewed from above.

As shown in FIG. 11, memory package 3B is arranged in the middle position of the lower case 2, causing package 3B to slip a little to the right relative to memory package 3A. The periphery of memory package 3B is protected by the inner-wall rib 2B. The inner-wall rib 2B has the same width in the second direction. As shown in FIG. 11, each of the memory packages 3A, 3B has a size of 14 mm×18 mm in the first and second directions, respectively.

Next, the SD card of FIG. 11 viewed from the lower case 2 will be described with reference to FIG. 12. FIG. 12 is a perspective view of SD card 100. As shown in FIG. 12, memory controller 12 is arranged on the circuit board 7 so as to overlap with memory package 3A as described above. Terminal unit 6, gold terminal patterns 50 to 58 corresponding to terminal unit 6, and resistive element group 5 are provided in specified positions on the circuit board 7.

With the semiconductor memory card of the first embodiment, the gold terminal patterns for exchanging data with the external unit are provided near memory controller 12 as described above. Accordingly, the length of the plurality of wires 71 connecting the resistive element group 5 and the bonding fingers 13 can be made 4.0 mm or less. Moreover, the length obtained by adding the wires 71 to the plurality of wires 70 connecting the terminal unit 6 and the resistive element group 5 can be made 10.0 mm or less. The wires 71 can be formed with a length error of within ±5%. Moreover, the length obtained by adding the wire 70 and the wire 71 is made with a length error of within ±5%.

Consequently, the distance of the signal path from the external unit to SD card 100 is short, enabling the transfer speed to be improved.

Since the length of the plurality of wires 70, 71 has only an error of ±5%, the transfer speed does not fluctuate, enabling data to be transferred with a stable accuracy.

Furthermore, with the semiconductor memory of the first embodiment, the two separate packages 3A, 3B are mounted on the circuit board 7. In the SD card, when the data transfer speed becomes faster, not only memory controller 12 that control the memory packages but also memory packages 3A, 3B become hot. With the semiconductor memory of the first embodiment, since the mounted packages are separated, the amount of heat generated by the packages can be dispersed. This makes it possible to avoid the problem of having a serious effect on the temperature characteristic of SD card 100 and causing SD card 100 to malfunction due to a temperature rise caused by heat generation.

As described above, the memory package 3B is placed on the circuit board 7 so as to slip a little to the right relative to the memory package 3A. Accordingly, the inner-wall rib 2B that protects the memory package 3B can be made to have the same width, producing an SD card with high resistance to bending.

Furthermore, with the semiconductor memory of the first embodiment, when the gold terminal patterns are plated with gold, the plating lead wires that transfer external voltages are caused to have the same length. Accordingly, the value of the transmission capacity of each of the plating lead wires 80 is made equal, which makes it possible to achieve a stable transfer speed in transferring data.

<Modification>

Figure 13:
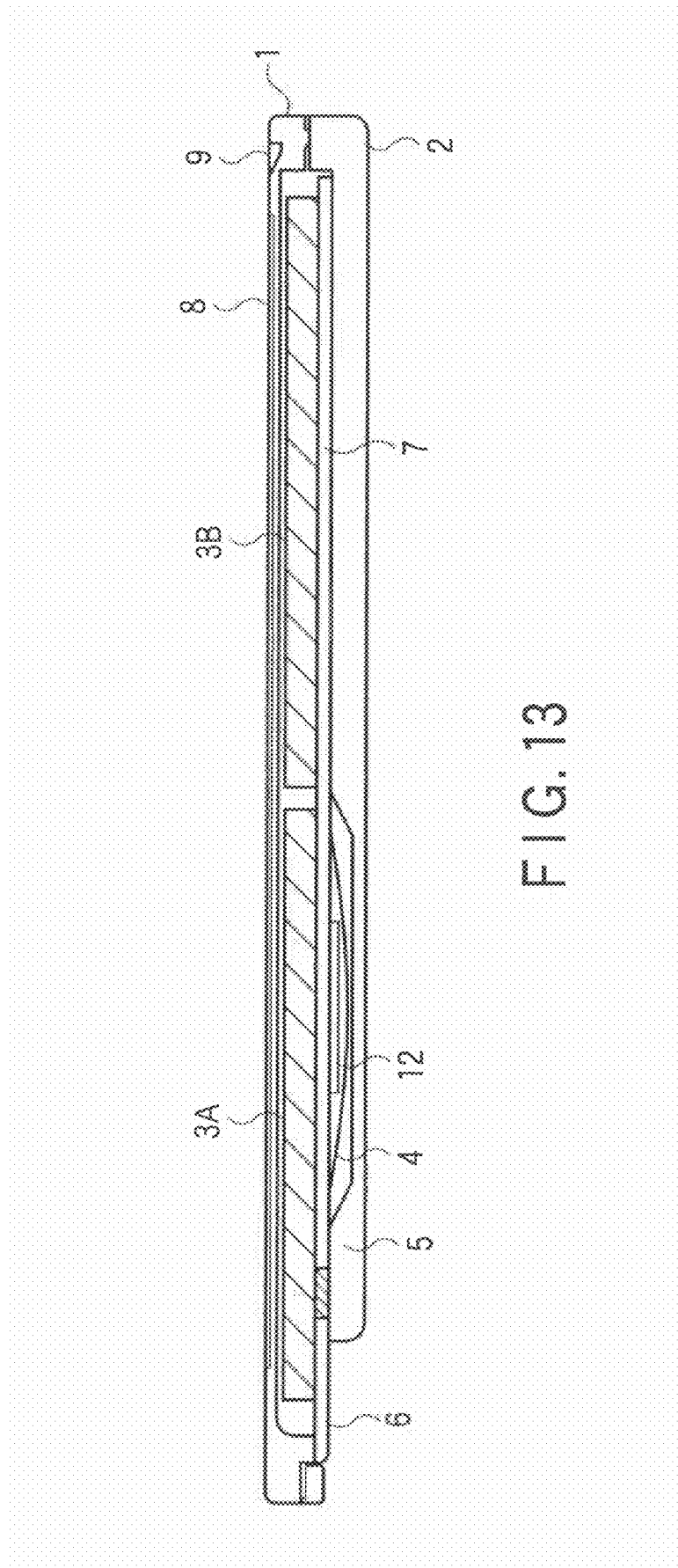
FIG. 13 is a sectional view of an SD card according to a modification of the first embodiment.

A semiconductor memory card according to a modification of the first embodiment will be explained with reference to FIG. 13. FIG. 13 is a sectional view of a semiconductor memory according to the modification. As shown in FIG. 13, the resistive element group 5 arranged on the circuit board 7 of FIG. 2 is embedded in the circuit board 7. As a result, a slipping part 90 in the area where the memory controller 12 arranged on the circuit board 7 is formed can be made smaller than that in FIG. 2 in the lower case 2. Even in this case, the lengths of the wires can be made 4.0 mm and 10.0 mm, respectively.

Even with the semiconductor memory card of the modification, a large volume of data can be transferred at a stable transfer speed and therefore the transfer characteristic of the semiconductor memory card can be improved as in the first embodiment.

Second Embodiment

Next, a second embodiment of the invention will be explained. A semiconductor memory card of the second embodiment is such that specific copper thin film patterns (conductor film patterns) are provided on the circuit board 7 of an SD card of the first embodiment. In the description below, the copper thin film patterns will be focused, and the other wires formed on the circuit board 7 and required for an operation of the semiconductor memory card will not be referred to. That is, a pattern which is illustrated into portions further than required wiring using the same copper thin film layer as the wiring is provide. In addition, an explanation of the same configuration as that of the first embodiment will be omitted.

FIG. 14 shows a case where copper thin film patterns 90, 91 of specific shapes are formed on the circuit board 7 of FIG. 6 of the first embodiment. That is, FIG. 14 shows the circuit board 7 viewed from the upper case 1 on which the memory packages 3A, 3B are mounded. As shown in FIG. 14, each of the copper thin film patterns 90 formed on the circuit board 7 has a circular shape and the copper thin film patterns 91 have a mesh pattern. First, the copper thin film patterns 90 will be explained.

The copper thin film patterns 90 are arranged mainly at the upper end (a first direction) of the circuit board 7. In FIG. 7, the copper thin film patterns 90 are arranged so as to be located just on the underside of the gold terminal patterns 50 to 58. Specifically, the copper thin film patterns 90 are formed from the upper end of the circuit board 7 (in the direction in which the gold terminal patterns are arranged) to the higher H3 or H4 (>H3) so as to surround the dummy terminals and solder resist aperture pattern 30 on the circuit board 7. The copper thin film patterns 90 are not grounded at any place. That is, the copper thin film patterns 90 are in the electrically floating state. As described above, each of the copper thin film patterns 90 has a circular pattern. That is, the inside of the solid circle is made of copper thin film patterns. The sum total of the areas of the copper thin film patterns 90 is made almost the same as the sum total of the total of the areas of the gold terminal patterns 50 to 58 and the total of the areas of the copper thin film patterns 90 formed on the same side of a memory controller 12 to be described later, i.e., on the side of the lower case 2.

Next, the copper thin film patterns 91 will be explained. The copper thin film patterns 91 are formed from the height H3 or H4 from the upper end of the circuit board 7 toward the lower end of the circuit board 7. In other words, the copper thin film patterns 91 are formed in an area of the circuit board 7 where the copper thin film patterns 90 have not been formed. The copper thin film patterns 91 cross one another so as to connect one another electrically. The copper thin film patterns 91 are grounded, setting their potential to zero. The sum total of the total of the areas of the copper thin film patterns 91 and the areas of the corresponding wires (not shown) formed on the circuit board 7 is made almost equal to the sum total of the total of the areas of a plurality of copper thin film patterns 91 formed on the surface on which the memory controller 12 is mounted (on the lower case side) and the areas of the corresponding wires (not shown) formed on the same side as the memory controller 12.

FIG. 15 shows a case where the copper thin film patterns 90, 91 of specific shapes are formed on the circuit board 7 of FIG. 7 of the first embodiment. FIG. 15 shows (the underside of) the circuit board 7 viewed from the lower case 2 on which the memory controller 12 for controlling the memory packages 3A, 3B is mounted. As in FIG. 14, each of the copper thin film patterns 90 formed on the underside of the circuit board 7 has a circular shape and the copper thin film patterns 91 have a mesh pattern. The copper thin film patterns 90 are not grounded. That is, the copper thin film patterns 90 are in the electrically floating state. The copper thin film patterns 91 are grounded as described above. The copper thin film patterns 91 are formed from the lower end of the gold terminal patterns 50 to 58 to the lower end of the circuit board 7 so as to cover the periphery of the memory controller 12. As described above, the sum total of the total of the areas of the copper thin film patterns 91 formed on the surface on which the memory controller is mounted and the areas of the corresponding wires (not shown) is made almost equal to the sum total of the total of the areas of a plurality of copper thin film patterns 91 formed on the same surface as the circuit board 7 on which the memory packages 3A, 3B are mounted and the areas of the corresponding wires (not shown).

Furthermore, the plating lead wire 90-0 to 90-8 for electrolytically plating the gold terminal patterns 50 to 58 may be pulled out of the upper end of the circuit board 7 as shown in FIG. 15. This is done to decrease the wiring capacity of the plating lead wires 90-0 to 90-8 by shortening the plating lead wires 90-0 to 90-8.

With the semiconductor memory card of the second embodiment, the copper thin film patterns 90 formed on the circuit board 7 are formed directly underneath the gold terminal patterns 50 to 58 formed on the underside of the circuit board 7 in FIG. 14. The copper thin film patterns 90 are made electrically floating. As a result, when the gold terminal patterns 50 to 58 exchange data with an external unit (not shown), the intensity of the electric field generated at the gold terminal patterns 50 to 58 and propagating toward the copper thin film patterns 90 decreases. If the copper thin film patterns 90 are grounded, the potential difference between the gold terminal patterns 50 to 58 and the copper thin film patterns 90 becomes large. Moreover, since the gold terminal patterns 50 to 58 and the copper thin film patterns 90 function as electrodes, the distance between the gold terminal patterns 50 to 58 and the copper thin film patterns 90 is short, and the circuit board 7 is made of a dielectric material (e.g., glass epoxy resin), the electric field intensity becomes large. In other words, the electrodes formed by the gold terminal patterns 50 to 58 and the copper thin film patterns 90 have an increased capacity. This may result in adverse effects on the transmission characteristics.

The above problems can be avoided because the copper thin film patterns are in the floating state. That is, when being made floating, the copper thin film patterns 90 do not function as electrodes for the gold terminal patterns 50 to 58, with the result that the intensity of the electric field decreases even if the electric field is directed toward the copper thin film patterns 90. Consequently, the capacity the gold terminal patterns 50 to 58 have decreases, which enables the data transfer speed to be increased.

Furthermore, a plurality of copper thin film patterns 90 as described in FIG. 14 are formed on the underside of the circuit board 7 on which gold terminal patterns 50 to 58 are arranged, thereby maintaining a structural balance. From an electrical viewpoint, the copper thin film patterns 90 should not be formed. However, if the copper thin film patterns 90 of FIG. 14 were not formed, the gold terminal patterns 50 to 58 would be formed on one side of the circuit board 7 and a warp would occur in the circuit board 7. As a result, the gold terminal patterns 50 to 58 themselves would bend.

With the semiconductor memory card of the embodiment, the bending of the gold terminal patterns 50 to 58 can be suppressed. Since the bending of the gold terminal patterns 50 to 58 can be suppressed, the change of the transmission characteristics in the gold terminal patterns 50 to 58 can be suppressed. Furthermore, an increase in the length of the wires 70 that connect the gold terminal patterns 50 to 58 and the resistive element group 5 and an increase in the length of the wires 71 that connect the resistive element 5 and the bonding fingers 13 can be suppressed. Since a change (an increase) in the wiring capacity of the wires 70 and 71 and adverse effects caused by the transmission loss of the gold terminal patterns 50 to 58 are suppressed, the deterioration of the data input/output characteristic can be suppressed (or the speeding-up movement is impaired).

As described above, the sum total of the areas of the copper thin film patterns 91 and the corresponding wires formed on the circuit board 7 on which the memory packages 3A, 3B are mounted is made equal to the sum total of the areas of the copper thin film patterns 91 and the corresponding wires formed on the circuit board 7 on which the memory controller 12 is mounted. With this structural balance of the circuit board 7, a warp in the circuit board 7 can be suppressed. The sum total of the areas of copper thin film patterns 90 and 91 formed in both sides of circuit board 7 may be smaller than the area which memory controller 12 occupies, and may be large.

In addition the sum total of the areas of the copper thin film patterns 91 and the corresponding wires formed on the circuit board 7 on which the memory packages 3A, 3B are mounted may be not made equal to the sum total of the areas of the copper thin film patterns 91 and the corresponding wires formed on the circuit board 7 on which the memory controller 12 is mounted. That is copper thin film patterns 90 and copper thin film patterns 91 should just be formed in both sides of circuit board 7 at least, respectively. In this case, the sum total of the areas of copper thin film patterns 90 and 91 formed in both sides of circuit board 7 may be smaller than the area which memory controller 12 occupies, and may be large.

In addition, the total sum of the area of the copper thin film patterns 91 formed in both sides of the circuit board 7, respectively may be formed more greatly than the area which memory controller 12 occupies. As described above, the copper thin film patterns 91 is grounded. That is, the grounding characteristic of the copper thin film patterns 91 improves by making area of the copper thin film patterns 91 larger than the area which memory controller 12 occupies. That is, the total sum of the area of the copper thin film patterns 91 formed in both sides of the circuit board 7, respectively forms more greatly than the area which memory controller 12 occupies. Accordingly a warp in the circuit board 7 can be suppressed, and also an electrical property can be improved.

While in the first embodiment, all the wires 71 have been made 4.0 mm or less in length, have been laid with an error of 5% or less of the average of the length of the wires 71, and have almost the same length, they may not have the same length from a wiring capacity viewpoint, provided that they are 4.0 mm or less in length. This makes it possible to decrease the wiring capacity of the wires 71, which enables data to be input and output at higher speed. This holds true for the sum of the lengths of the wires 70 and 71.

Specifically, while the wires 70, 71 have been laid with an error of 5% or less of the average of the sum of the lengths of the wires 70 and 71, they may not have the same length from a wiring capacity viewpoint, provided that they are 10.0 mm or less in length. This makes it possible to decrease the wiring capacity of the wires 70.

The embodiment is not limited to the first and second embodiments. For instance, the memory packages 3A, 3B of the first and second embodiments are not restricted to NAND flash memories and may be, for example, another semiconductor memory, such as a DRAM.

The signal lines that connect the electrode pads and the bonding fingers on the surface of memory packages are not limited to bonding wires.

The first and second embodiments may be applied to any suitable array other than the land grid array. The embodiments are not restricted to an SD card and may be applied to any suitable memory card, provided that the memory card has a memory package and a memory controller for controlling the memory package.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory card comprising:
a first semiconductor memory and a second semiconductor memory which are mounted on one surface of a substrate;
a controller which is mounted on the other surface of the substrate and which controls the first semiconductor memory and the second semiconductor memory;
a plurality of input/output terminals which input and output signals to and from the first semiconductor memory and the second semiconductor memory via the controller;
a plurality of resistive elements which electrically connect the plurality of input/output terminals to the controller;
a plurality of first wires which connect one-side ends of each of the plurality of resistive elements to the controller and each of which has a wire length of 4.0 mm or less, and
a plurality of second wires which connect the other-side ends of each of the plurality of resistive elements to the input/output terminals.

2. The card according to claim 1,
wherein the plurality of second wires connect the other-side ends of each of the plurality of resistive elements to each of the plurality of input/output terminals in a one-to-one correspondence, and
the sum of the length of each of the first wires and the length of each of the plurality of second wires in the path of each of the signals between the plurality of input/output terminals and the controller via the plurality of resistive elements is 10.0 mm or less.

3. The card according to claim 2,
wherein the sum of the length of each of the plurality of first wires and the length of each of the plurality of second wires in the path of each of the signals is designed to have an error of within ±5% of the average of the sum of the lengths of each of the plurality of first wires and each of the plurality of second wires.

4. The card according to claim 2, further comprising:
a plurality of first metal films which are formed in a region overlapping with a region where the input/output terminals are formed and which are made electrically floating on the one surface; and
a plurality of second metal films which are formed so as to surround the first semiconductor memory and the controller in regions where the plurality of first metal films have not been formed on the one and the other surfaces of the substrate and which is grounded.

5. The card according to claim 4,
wherein the plurality of first metal films are further formed on the other surface of the substrate, and the sum of the areas of the plurality of first metal films and the plurality of second metal films formed on the one surface of the substrate and the sum of the areas of the plurality of first metal films and the plurality of second metal films formed on the other surface of the substrate are larger than the area of the controller arranged on the other surface of the substrate.

6. The card according to claim 4,
wherein the areas of the plurality of second metal films formed on the one surface of the substrate and the areas of the plurality of second metal films formed on the other surface of the substrate are larger than the area of the controller arranged on the other surface of the substrate.

7. The card according to claim 4,
wherein the plurality of second metal films are formed in a region which faces the input/output terminals in respect to the controller and which overlap with the region where the first semiconductor memory is formed.

8. The card according to claim 1,
wherein each of the plurality of first wires is formed with an error of within ±5% of the average of the lengths of the plurality of first wires.

9. The card according to claim 1,
wherein the plurality of first wires and the plurality of second wires are formed on the surface of the substrate.

10. A semiconductor memory card comprising:
a first semiconductor memory and a second semiconductor memory which are mounted on one surface of a substrate:
a controller which is mounted on the other surface of the substrate and which controls the first semiconductor memory and the second semiconductor memory;
a plurality of input/output terminals which are formed on the surface on which the controller is mounted and which input and output data to and from the first semiconductor memory and a second semiconductor memory via the controller; and
a plurality of resistive elements which terminate signals propagating through the input/output terminals in inputting and outputting the data;
a plurality of first wires which connect one-side ends of each of the plurality of resistive elements to the controller and each of which has a wire length of 4.0 mm or less; and
a plurality of second wires which connect the other-side ends of each of the resistive elements to the input/output terminals.

11. The card according to claim 10,
wherein the plurality of second wires connect the other-side ends of each of the plurality of resistive elements to each of the input/output terminals in a one-to-one correspondence, and
the sum of the length of each of the plurality of first wires and the length of each of the plurality of second wires in the path of each of the signals between the input/output terminals and the controller via the plurality of resistive elements is 10.0 mm or less.

12. The card according to claim 10, further comprising:

a plurality of first metal films which are formed in a region facing a region where the plurality of input/output terminals are formed with the substrate therebetween and which are made electrically floating on the one surface of the substrate on which the semiconductor memory is mounted, and a plurality of second metal films which are formed so as to surround the semiconductor memory and the controller in regions where the plurality of first metal films have not been formed on the one and the other surfaces of the substrate and which are grounded.

13. The card according to claim 12, wherein the sum of the areas of the plurality of first metal films and the plurality of second metal films formed on the one surface of the substrate and the sum of the areas of the plurality of first metal films and the plurality of second metal films formed on the other surface of the substrate are larger than the area of the controller arranged on the other surface of the substrate.

14. The card according to claim 12, wherein the areas of the plurality of second metals film formed on the one surface of the substrate and the areas of the plurality of second metal films formed on the other surface of the substrate are larger than the area of the controller arranged on the other surface of the substrate.

* * * * *